Figure 1:
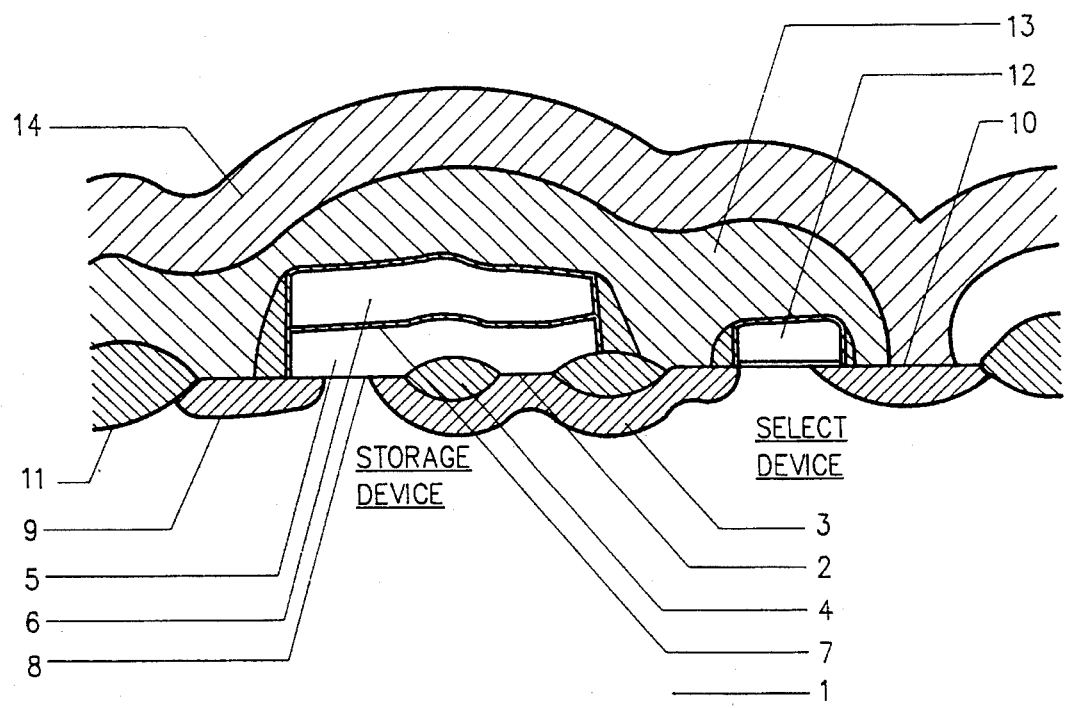

United States Patent [19]
Thomas

[11] Patent Number: 5,506,431
[45] Date of Patent: Apr. 9, 1996

[54] DOUBLE POLY TRENCHED CHANNEL ACCELERATED TUNNELING ELECTRON (DPT-CATE) CELL, FOR MEMORY APPLICATIONS

[76] Inventor: Mammen Thomas, 1081 Corvette Dr., San Jose, Calif. 95129-2906

[21] Appl. No.: 243,507

[22] Filed: May 16, 1994

[51] Int. Cl.$^6$ ............................ H01L 29/78; G11C 13/00
[52] U.S. Cl. ................ 368/185.15; 257/321; 365/185.28
[58] Field of Search ...................................... 365/182, 185, 365/184, 149; 257/298, 301, 302, 303, 314

[56] References Cited

U.S. PATENT DOCUMENTS

| | | | |
|---|---|---|---|
| Re. 33,261 | 7/1990 | Baglee | 357/23.6 |
| 4,855,800 | 8/1989 | Esquivel et al. | 365/185 |
| 5,146,426 | 9/1992 | Mukherjee et al. | 365/149 |

Primary Examiner—Viet Q. Nguyen

[57] ABSTRACT

A structure for low voltage, high density, non-volatile memory cell, with ability to write electrically using the CACT or Channel Accelerated Carrier Tunneling method for programming memories and erase electrically by tunneling, having separate regions for write and erase for high reliability, is described. These cells have the ability to write by transferring charge to the storage gate using the majority carriers in the channel of the MOS transistor, eliminating the need for generation of high fields needed for the hot electron EPROM write method used in the prior art flash memories. In addition the use of the carrier velocity to enhance the write process reduce the need for the high write -voltages on the gates as compared to the present EEPROM and EPROM write memories.

20 Claims, 3 Drawing Sheets

DPT - CATE CELL

EEPROM CELL (CROSS SECTION)

PRIOR ART

FLASH CELL (PRIOR ART)

DPT - CATE CELL

DOUBLE POLY TRENCHED CHANNEL ACCELERATED TUNNELING ELECTRON (DPT-CATE) CELL, FOR MEMORY APPLICATIONS

BACKGROUND

1. Field of Invention

This invention relates to a high reliability non volatile memory cell structure, which can be electrically written and erased for high density, low voltage applications.

2. Description of Prior Art

The current electrically programmable and erasable non volatile memory cells consists of EEPROMs (Electrically Erasable Programmable ROMs) and Flash Memories.

The EEPROMs (FIG. 1) are as the name implies electrically programmable and erasable. They are programmed and erased through a thin oxide area called tunnel area which normally has an oxide thickness between 50 and 120 Angstroms and is grown on top of a doped silicon region, By applying a high voltage across this tunnel oxide the electrons can be made to move to and from a floating gate over the tunnel oxide. The tunnel process is a very slow process and hence the EEPROMs are slow to write and slow to erase. During erase the devices are made to go into depletion by removing electrons from the floating gate. In order to have an array of devices operate in series it is necessary to have an isolation transistor in series with the storage device. The need for a separate tunnel area with diffusion and need for additional isolation transistor make the EEPROM cells large in size and hence unsuitable for high density applications.

The typical Flash Cell (FIG. 2) is a new development and is an electrically erasable programmable ROM cell which use the EPROM or hot write to achieve fast write operation and the tunnel process to erase. A high drain voltage is applied to the cell to generate a large volume of careers by impact ionization at the drain depletion region when the device operates under saturated conditions. The ionized carriers will consist of both electrons and holes and these will have velocities in random directions. The positively charged holes generated during impact ionization, get collected by the substrate and flow to ground producing a large current component which is wasted. A very small percentage of the electrons generated by impact ionization will have velocity component which is in a direction suitable for collection by the floating gate electrode. These will be accelerated towards the floating gate(7a) by the high voltage on the floating gate which is coupled down from the control gate(9a) through the thin insulating layer(Sa). These electrons are collected by the floating gate and are stored in the floating gate providing a net negative charge in the floating gate electrode. The balance of the electrons generated flow to the drain and are returned to the supply. The charge due to the carriers collected by the floating gate modify the threshold of the device indicating a charged state. The erase is accomplished by allowing the electrons to tunnel through the thin gate oxide, typically 50 to 120 A in thickness, by application of a high voltage to one of the junctions, preferably the source junction (4a), while holding the control gate(9a) at low or zero voltage. The erase can also be accomplished by application of a negative voltage to the control gate and simultaneously applying a positive voltage to the source. The tunneling takes place from the floating gate to the source region edge(13a) which is thermally driven under the gate oxide.

The present day Flash cells suffer from a number of problems to achieve low power and low voltage applications. These include but are not limited to:

1. The flash cells need high power supply to provide high current at relatively high voltage to the drain of the flash device. The high voltage is necessary to ensure existence of high fields at the drain depletion region to achieve hot electron generation and high currents are needed to ensure that sufficient electrons with the correct velocity component are available to be collected by the floating gate.

2. Only a small portion of the generated carriers are usable, the balance is wasted as drain current and as substrate current. This is due to the fact that in a typical flash, during hot carrier generation, the generated electrons have random velocities and only those with a velocity component towards the floating gate are collected, the rest being collected by the drain. The generated holes are all collected by the substrate terminal and are removed as non usable.

3. The large substrate current component can cause reliability problems due to latchup in nearby circuits by charging up the substrate.

4. The need for large drain voltages mandate increased spacing requirements between cells, increasing the area required to achieve a given density of memory.

5. The need to use high drain voltage also reduce the horizontal scalability of the cell by requiring a minimum gate length to withstand the applied voltage.

6. Vertical scaling with reduction in gate oxide thickness for improved performance will also create problems for the cell by allowing tunneling at voltages close to the applied drain voltage and hence cause disturb problems.

7. The use of thinner gate oxide in current flash cells make sustaining the field at the drain more difficult and act against the carrier generation need.

8. The inability to thin down the gate oxide due to the need for high field generation at the drain makes the use of high erase voltage a must, typical erase voltages needed is approximately 10 V across a 100 A oxide.

OBJECTS AND ADVANTAGES

The Double Poly Trenched Channel Accelerated Tunneling Electron Cell disclosed has a number of advantages over the existing flash memory cells, 1. The cell uses the majority carriers in the channel as the major charging carriers and do not depend on the high fields at the junction to generate hot carriers for charging.

2. The use of majority carriers and reduction of impact ionization allow lower voltages to be applied on the accelerating junctions.

3. The reduction in impact ionization reduces the formation of unusable positive charge careers which constitute a large component of the supplied current during programming thereby reducing the power supply capability needed.

4. The use of the velocity of careers in the channel to enhance the write characteristics of the cell allow reduced applied voltage on the gate electrodes.

5. The reduction in the depletion layer fields due to reduced junction voltages applied and the reduced field across the oxides from lower applied gate voltages improve the reliability of the cell.

6. Reduction or elimination of impact ionization reduce latch-up problems and associated reliability concerns fur the cell.

7. The use of lower voltages at the junctions and the gates for programming make the cell suitable for low voltage programming operations and single power supply operations.

8. The lower voltages and currents used allow better vertical scaling of oxides and junctions allowing the optimum use of technology advances.

9. The reduced voltage of operation allows tier reduced isolation requirements and allow for closer packing of the cells.

DRAWING FIGURES

FIG. 1—is the cross-section of an EEPROM cell

Figure 2:
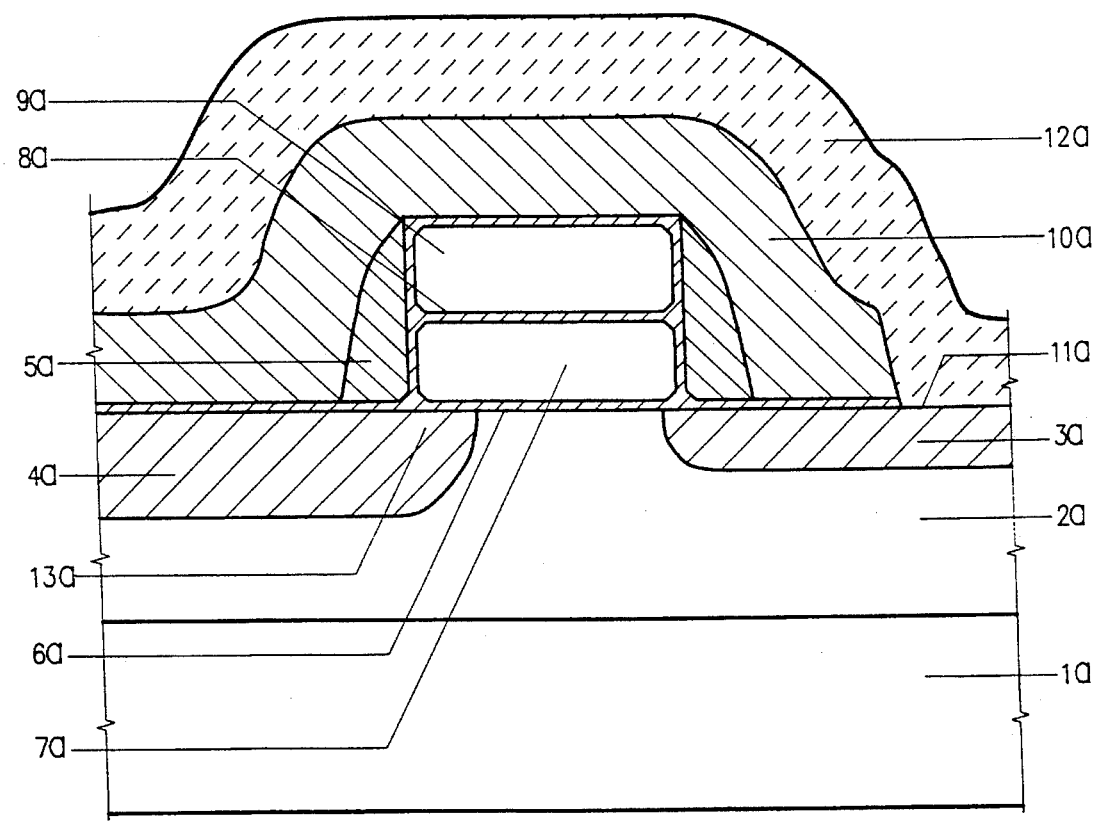

FIG. 2—is the cross-section of a prior art flash cell.

Figure 3:
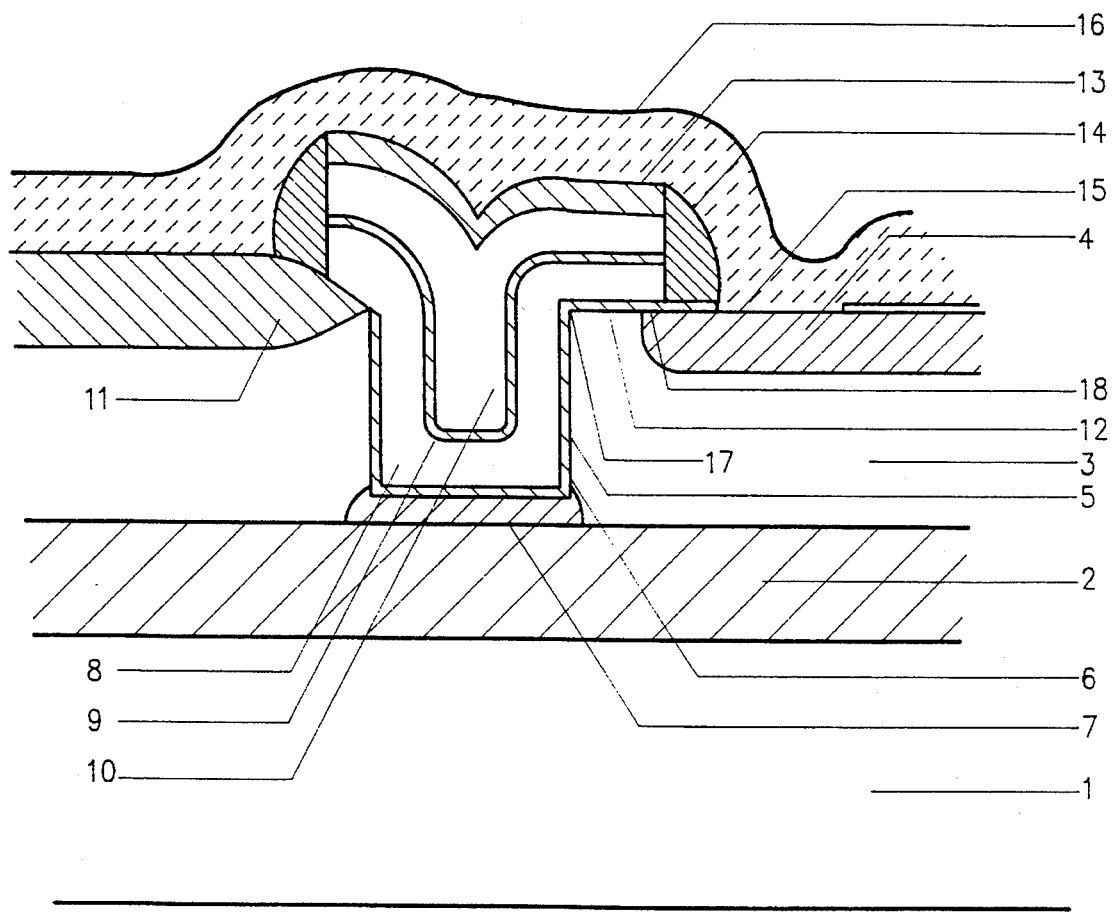

FIG. 3—is the completed cross-section of the Double Poly Trenched Channel Accelerated Tunneling Electron (DPT-CATE) cell.

REFERENCE NUMERALS IN DRAWING

Reference numerals in FIG. 1, (EEPROM cross-section)
1. Semiconductor substrate.
2. Tunnel oxide.
3. Tunnel Diffusion.
4. Buried oxide.
5. Floating gate electrode.
6. Control gate electrode.
7. Dielectric, ONO or oxide.
8. Gate Oxide.
9. Source diffusion.
10. Drain diffusion contact of select device.
11. Field oxide.
12. Select transistor, word line.
13. Inter-layer protection oxide.
14. Metal bit line.

Reference numerals in FIG. 2. (prior art flash cell cross-section)
1a—Semiconductor substrate material
2a—Epitaxial silicon material.
3a—Drain contact.
4a—Deep source diffusion.
5a—Side wall oxide spacer.
6a—Thin tunnel/gate oxide.
7a—Floating gate polysilicon.
8a—Inter-poly dielectric.
9a—word line polysilicon/control gate.
10a—Isolation oxide.
11a—Etched contact.
12a—Bit line.
13a—Tunnel erase region due to source diffusion edge.
14l—Write junction/oxide interface for hot electron write.

Reference numerals in FIG. 3 (DPT-CATE cell cross-section)
1. Substrate silicon material
2. Highly doped (source) buried layer.
3. Epitaxial layer.
4. Doped region forming contact (drain).
5. Trench into silicon.
6. Gate oxide on trench side wall.
7. Implant into bottom of trench to ensure contact to buried layer
8. Floating polysilicon for data storage (polysilicon 1).
9. Inter poly dielectric layer.
10. Word line polysilicon layer (polysilicon 2).
11. Field oxide for isolation.
12. Tunnel oxide.
13. insulating dielectric layer.
14. Spacer.
15. Drain contact to metal bit line.
16. Bit line.
17. Channel discontinuity (at intersection of vertical and horizontal channel regions—CACT write region.)
18. Tunnel erase region with diffusion underlap of gate.

DESCRIPTION OF THE INVENTION

Structure of the Double Poly Trenched Channel Accelerated Tunneling Electron Cell (DPT-CATE Cell)

The present invention relates to the structure and operation of a memory cell in FIG. 3, which can be used to manufacture high density non-volatile memories. The cell uses the method of channel accelerated carrier tunneling (Patent application Ser. No. 08/209,787 of filing date Mar. 11, 1994), to achieve the storage of the data into the cell and tunnel process to erase the data stored in the cell.

A typical cell is constructed on a semiconductor substrate of the correct type and orientation, typically p-type <100> silicon (1), for the embodiment described with a highly doped buried layer (2) coveting the array area formed by implanting an N+ impurity similar to that for formation of an NPN device, and depositing an epitaxial layer of a semiconducting material having an impurity of the opposite type over the entire wafer surface. The thickness of the epitaxial layer is typically of the order of 1.0 to 4.0 microns. (If an N substrate can be used instead of P, the buffed layer process can be eliminated and the epi can be deposited on the substrate. The cell is isolated from the neighboring cells by a field oxidation creating an oxide of sufficient thickness on the surface of the silicon as is well understood by practitioners of the art. A trench (5) is etched into the epitaxial silicon layer to form a step at the surface of the silicon. The depth of the etched trench typically will be from 0.4 to 2.5 microns. The sidewall and the bottom of the trench are oxidized to a thickness, typically of 125 to 340 A, to provide a good gate oxide(6). An implant of an impurity, typically Arsenic or phosphorus, is done into the bottom of the trench. This is to ensure that the epitaxial layer left under the trench is doped with the same impurity type as the buried layer such that the oxide at the bottom of the trench and the sidewall oxide close to the bottom of the trench are in contact with the buried layer (2) through the doped region (7) forming the source of the device. A thin tunnel oxide (12) is grown on the surface of the silicon typically having a thickness of 50 to 125 A. A first conductive layer, typically of doped polysilicon, polysilicon-1, (8) to form the floating gate, is deposited, on the surface of the gate oxide and tunnel oxide. A second conductive layer, typically doped polysilicon layer, polysilicon-2(10), is now deposited on the first polysilicon layer, but is separated from it by the interlayer dielectric (9), typically made of oxide or ONO, a sandwich of oxide and nitride layers. The polysilicon-2(10) is coupled to the floating polysilicon, polysilicon-1(8) capacitively across the interpoly dielectric layer(9). The characteristics of the interpoly dielectric layer is hence optimized to withstand high voltages, typically 3 to 20 v and provide high degree of coupling. The stacked polysilicon is defined by photo lithography and stack etch to define the cell poly edges. The drain (4) of the device is formed, away from the sidewall of the trench, by implanting dopant of the opposite type to the epitaxial silicon into the region out side the poly silicon area, but limited by the field oxide (11). The drain diffusion is thermally driven under the tunnel oxide to provide enough area for erase (12) to take place by tunneling from the floating gate over the tunnel oxide, through the tunnel oxide to the diffusion. The intersection of the trench with the gate oxide(6) on the side wall with the epitaxial surface having the tunnel oxide thereon (12) form the necessary discontinuity(17) in the channel, formed in the semiconducting material under the gate and tunnel oxides between the drain and the source doped regions, to enable write by majority carriers accelerated in the channel. A third conductive layer(16) typically metal 1, over lying the device but making contact to the diffused region (4) at contact (15) form the bit line for the device. Use of the spacer (14) to serf align the contact region, while insulating the edges of the poly stack, is an option disclosed in the present embodiment, which will allow the cell to be made small as compared to a non serf aligned cell with masked contact etch.

Operation of the Double Poly Trenched Channel Accelerated Tunneling Electron Cell (DPT-CATE CELL)

a) Read

The cell is read by applying a voltage typically in the range of 0.5 to 2.5 V on the drain (4) and applying a second voltage typically from 2 to 5 V on the poly silicon word line forming the control gate(10) and sensing the current in the cell. The control gate voltage will be coupled to the floating gate(8) through the inter poly dielectric (9). If the cell is in a written condition, typically with negative charge accumulated on the floating gate(8), the threshold voltage (Vt) of the device will be high and the current flow will be small, typically limited to leakage currents. If it is an erased cell with zero charge in the floating gate, the voltage coupled down to the floating gate (8) from the control gate(10) will turn the cell on and a cell current will flow in the bit line. This information is sensed and used to indicate the state of the cell.

b) Write

The cell is written using the Channel Accelerated Carrier Tunneling or CACT method using majority carries in the channel. A high voltage is applied to the word line polysilicon (10), typically of the order of 8 to 20 V which gets capacitively coupled down to the floating gate polysilicon(8) across the interpoly dielectric (9). A drain voltage is now applied to the device through the bit line, typically of 3 to 5 V to accelerate the carriers in the channel. The carriers attain high velocities during the transport in the channel along the side wall of the trench under gate oxide (6) and will encounter the discontinuity (17)in the channel with a velocity component directed towards oxide(12) and floating polysilicon on top of the oxide. This velocity component enhances the voltage gradient at that location due to the coupled down voltage on the floating gate from the control gate and allow the channel electrons to get collected by the floating gate there by charging the gate negative. The availability of a large volume of carriers with the correct velocity component to be collected, eliminate the need for generation of hot electrons by impact ionization at the drains for write to take place. This eliminates the need for high drain voltages and currents needed by the prior art cells during writing. The collected carriers change the Vt of the cell and hence store data in the floating gate electrode.

c) Erase

The cell is erased by providing a suitable voltage gradient across the tunnel oxide so as to cause the charge stored in the floating gate to tunnel out through the thin oxide area over the drain diffusion. The basic phenomena is the tunneling of carriers, typically electrons through the oxide interface. Two methods of applying the necessary voltage gradient exists a) the word line poly silicon is held at ground potential while the drain junction is raised to a high positive voltage, typically from 10 to 17 V depending on the tunnel oxide thickness, with the source floating. This will apply a high voltage gradient across the diffusion underlap of the oxide(18) and the polysilicon (8) over lying the tunnel oxide at this region. If the gradient is sufficient tunneling will take place removing negative charge from the floating gate, erasing the cell. b) The word line (10) is raised to a negative voltage, typically −5 to −12 V, depending on the tunnel thickness and increasing the drain voltage to a high value to cause tunneling to take place, typically from 5 to 10 V. This method (b) is the preferred method for this embodiment as the source does not have to be floating during erase and also it allows bits, bytes, blocks or the whole array to be erased as necessary.

Advantages of the Cell Disclosed

The Double Poly Trenched Channel Accelerated Tunneling Electron cell has a number of advantages over the prior art flash cells They are:

1. The cell uses the velocity of the majority carriers in the channel to write and store data. The carrier velocity component is by design of the channel in a direction which will enhance the write process providing high efficiency write.

2. The use of majority carriers eliminate the need for deliberate hot carrier generation by impact ionization and hence allow lower voltages to be applied at the junctions. This reduces the need for high current, high power supply to provide the carriers.

3. The reduction in impact ionization reduces the formation of large volume of unusable positive charge carriers which constitute a large component of the supplied current, wasted as substrate current, during programming, thereby reducing even further, the power supply capability needed.

4. The use of the velocity of carriers in the channel to enhance the write characteristics of the cell allow reduced applied voltage on the gate electrodes.

5. The reduction in the depletion layer fields due to reduced junction voltages applied reduce the hot electron degradation of the cell and hence improve the reliability.

6. Reduction or elimination of impact ionization reduce latch-up problems, caused by large substrate currents, and associated reliability concerns for the cell.

7. The use of lower power, both currents and voltages for programming make the cell suitable for low voltage programming operations and single power supply operations. This is especially true for memory operation with 3 V or lower power supply voltages.

8. The lower voltages and currents used low better vertical scaling of oxides and junctions based on optimized erase characteristics, allowing the optimum use of technology advances.

9. The reduced voltage of operation allows for reduced isolation requirements and allow for closer packing of the cells.

10. The cell allows the use of optimum oxide thicknesses in the different regions of the channel, for acceleration of carriers and for write,/erase, again increasing the overall reliability and efficiency of operation.

11. The cell has the advantage that it allows for byte, block or bulk erase to be done as both write and erase are carded out through application of voltages at the drain and not the source of the cell.

SUMMARY, RAMIFICATIONS AND SCOPE

The structure and operation of a non volatile cell, DPT-CATE cell, using channel accelerated career tunneling (CACT) method of programming has been disclosed. The cell is electrically programmable and erasable and falls into the nonvolatile category. The cell is disposed along the side wall of a trench and the surface of silicon with a channel discontinuity being formed at the intersection of the surface with the trench side wall. The oxide on the surface of the silicon has optimized thickness to allow tunneling between the drain junction underlap of gate and the floating gate during erase. During the write process, the trench side wall gate is used to accelerate and direct the carriers in the channel towards the oxide separating the channel from the floating gate at the discontinuity formed due to the intersection of the vertical and horizontal channels intersecting. The velocity component of the carriers directed as discussed are used to enhance the write process and hence reduce the voltage required to be applied on the control gate of the cell. The availability of large carrier concentration with the correct velocity component as they reach the discontinuity eliminate the need for hot electron generation by application of high drain voltages at the junctions for hot carrier generation during write. The structure allows separate region for write and erase, drain voltage controlled write and erase allowing ease of design, high reliability due to lower oxide stresses, reduced latch up potential, lower voltage operation and high density of packing and low voltage operation. The major advantages of the DPT-CATE cell are:

1. Small cell with reduced requirement for isolation make higher packing density.
2. High reliability operation.
3. Lower power requirement, allowing portable applications.
4. Low voltage power supply operation.
5. Lithography independent gate length.
6. Optimized tunnel oxide for erase.
7. Ability to shrink with availability of technology.
8. Ability to do byte or bulk erase by application of drain and gate voltages.

What is claimed is:

1. A non-volatile memory cell capable of being electrically erased by tunneling and programmed using the electrons in the channel directly, by channel accelerated carrier tunneling, comprising, a semiconducting substrate, doped with an impurity of a first type a buried layer, doped with an impurity of a second type opposite the impurity of the first type, introduced into the substrate, an epitaxial layer having an impurity of the first type deposed on the substrate, a trench in the epitaxial layer producing a step at a surface, a gate oxide deposed on a side wall of the trench, a source formed by an implant of the impurity of the first type into the bottom of the trench, the source doping making contact to the buried layer doping, a tunnel oxide deposed on the surface of the epitaxial layer adjacent the trench, a first conductive layer deposed over the gate oxide and the tunnel oxide forming a floating gate storage node, an interlayer dielectric deposed over the first conductive layer, a second conductive layer deposed over the first conductive layer, separated from it by, but capacitively coupled to it through, the interlayer dielectric, a drain formed on the surface of the epitaxial layer, spaced away from the side wall of the trench, by doping the epitaxial layer with an impurity of the second type, the drain driven under the tunnel oxide and floating gate providing an area for tunnel erase from the floating gate to the dram through the tunnel oxide, a channel under the gate oxide and tunnel oxide, between the source and the drain, a discontinuity in the channel at the intersection of the sidewall with the gate oxide and the surface of the epitaxial layer with the tunnel oxide thereon, enabling write by channel accelerated career tunneling, a third conductive layer making contact to the dram at a contact forming a bit line.

2. The non-volatile memory cell capable of being electrically erased by tunneling and programmed by channel accelerated carrier tunneling, of claim 1 wherein the semiconducting substrate is silicon.

3. The non-volatile memory cell capable of being electrically erased by tunneling and programmed by channel accelerated carrier tunneling, of claim 1 wherein the epitaxial layer is silicon epitaxial layer.

4. The non-volatile memory cell capable of being electrically erased by tunneling and programmed by channel accelerated carrier tunneling, of claim 1 wherein the first and second conductive layers are polysilicon.

5. The non-volatile memory cell capable of being electrically erased by tunneling and programmed by channel accelerated carrier tunneling, of claim 1 wherein the source connection is through the doped buried layer being in contact with the source doping at the bottom of the trench.

6. The non-volatile memory cell capable of being electrically erased by tunneling and programmed by channel accelerated carrier tunneling, of claim 1 whereto the gate oxide and the tunnel oxide thicknesses are independently optimized.

7. The non-volatile memory cell capable of being electrically erased by tunneling and programmed by channel accelerated carrier tunneling, of claim 1 wherein the gate oxide has a thickness optimized for acceleration of carriers in the channel for channel accelerated carrier tunneling.

8. The non-volatile memory cell capable of being electrically erased by tunneling and programmed by channel accelerated carrier tunneling, of claim 1 wherein the tunnel oxide has a thickness optimized for tunnel erase.

9. The non-volatile memory cell capable of being electrically erased by tunneling and programmed by channel accelerated carrier tunneling, of claim 1 wherein the dielectric layer separating the floating gate from the control gate is silicon dioxide.

10. The non-volatile memory cell capable of being electrically erased by tunneling and programmed by channel accelerated carrier tunneling, of claim 1 wherein the dielectric layer separating the floating gate storage node from the control gate is a sandwich of silicon dioxide and silicon nitride layers.

11. The non-volatile memory cell capable of being electrically erased by tunneling and programmed by channel accelerated carrier tunneling, of claim 1 wherein the write takes place at the discontinuity in the channel away from the doped drain and source regions.

12. The non-volatile memory cell capable of being electrically erased by tunneling and programmed by channel accelerated carrier tunneling, of claim 1 wherein the separate write and erase regions enhance reliability of the cell.

13. A non-volatile memory device of the type capable of being electrically erased by tunneling and programmed by carrier accelerated tunneling, having
- a first conductive floating gate layer forming a storage node, an insulating dielectric layer overlaying the floating gate layer,
- a second conductive control gate layer overlaying the insulating dielectric layer but capacitively coupled to the floating gate layer,
- the floating gate layer positioned over a gate oxide deposed on a side wall of a trench etched in a semiconducting material, and over a tunnel oxide deposed on a horizontal surface of the semiconducting material adjacent the trench,
- a channel in the semiconducting material under the gate and tunnel oxides, between a doped drain region on the surface of the semiconducting material and a doped source region adjacent the bottom of the trench,
- a tunnel erase region formed by the floating gate layer overlapping a portion of the doped drain region, but separated from it by the tunnel oxide where tunnel erase takes place by application of a voltage gradient across the tunnel oxide between the floating gate layer and the doped drain.
- a discontinuity in the channel, at the intersection of the gate oxide on the side wall of the trench and the tunnel oxide oil the horizontal surface of the semiconducting material, towards which discontinuity, carriers in the channel under the gate oxide, are accelerated during write operation, and where velocity enhanced, channel accelerated carrier tunneling takes place resulting in carrier accumulation in the storage node, eliminating the need for deliberate hot carrier generation by impact ionization.

14. The non-volatile memory device of the type capable of being electrically erased by tunneling and programmed by channel accelerated carrier tunneling method of claim 13 wherein the carriers are accelerated in the channel by application of a first voltage between the drain region and the source region and by application of a second voltage between the floating gate layer and tile source region, during write operation.

15. The non-volatile memory device of the type capable of being electrically erased by tunneling and programmed by channel accelerated carrier tunneling method of claim 13 wherein the voltage applied between the floating gate layer and the source is sufficient to provide the accelerated carrier in the channel enough additional energy to cause tunneling at the discontinuity and get collected by the storage node during programming operation.

16. The non-volatile memory device of the type capable of being electrically erased by tunneling and programmed by channel accelerated carrier tunneling method, of claim 13 wherein the carriers are electrons.

17. The non-volatile memory device of the type capable of being electrically erased by tunneling and programmed by channel accelerated carrier tunneling method, of claim 13 wherein the voltage gradient for erase is by application of a negative voltage on the floating gate and a positive voltage on the drain.

18. A non-volatile memory device of the type capable of being electrically erased by tunneling and programmed by channel accelerated carrier tunneling method, having
- a first conductive floating gate layer forming a storage node, an insulating dielectric layer overlaying the floating gate layer,
- a second conductive control gate layer overlaying the insulating dielectric layer but capacitively coupled to the floating gate layer,
- the floating gate layer positioned over a gate oxide deposed on a side wall of a trench etched in a semiconducting material and over a tunnel oxide deposed on a horizontal surface of the semiconducting material adjacent the trench,
- a channel in the semiconducting material, under the gate oxide and the tunnel oxide between a doped drain region on the surface of the semiconducting material and a doped source region adjacent the bottom of the trench,
- a discontinuity in the channel at the intersection of the gate oxide on the side wall the trench and the tunnel oxide on the horizontal surface of the semiconducting material,
- wherein the use of carriers in the channel forming the majority carriers, accelerated towards the discontinuity to write the memory cell eliminate the need for deliberate hot carrier generation by impact ionization at the drain.

19. The non-volatile memory device of the type capable of being electrically erased by tunneling and programmed by channel accelerated carrier tunneling method, of claim 18 wherein the elimination of the deliberate hot carrier generation by impact ionization reduce the formation of unused carriers of opposite polarity, removed through the semiconducting material forming a substrate current.

20. The non-volatile memory device of the type capable of being electrically erased by tunneling and programmed by channel accelerated carrier tunneling method, of claim 18 wherein the reduction of substrate current providing improved cell reliability.

* * * * *